US006308025B1

(12) United States Patent
Okano et al.

(10) Patent No.: US 6,308,025 B1
(45) Date of Patent: Oct. 23, 2001

(54) ELECTROPHOTOGRAPHY APPARATUS

(75) Inventors: Tadashi Okano; Tetsuji Takegoshi; Kazuo Kikuchi; Toru Hanashima; Kazuhiro Wakamatsu, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/633,821

(22) Filed: Aug. 7, 2000

(30) Foreign Application Priority Data

Aug. 10, 1999 (JP) .................................... 11-226075

(51) Int. Cl.[7] ..................... G03F 15/00; B41J 2/41; G01D 15/28

(52) U.S. Cl. ..................... 399/107; 347/152; 399/108

(58) Field of Search ..................... 399/107, 108, 399/110, 441; 347/108, 152, 263; 174/52.1; 361/728

(56) References Cited

U.S. PATENT DOCUMENTS 4,635,010 * 1/1987 Miyai et al. .................. 399/108
4,702,587 * 10/1987 Miyoshi .................. 399/110
4,789,876 * 12/1988 Miyai et al. .................. 399/108
5,572,298 * 11/1996 Nagahara et al. .................. 399/107
5,881,340 * 3/1999 Stickney et al. .................. 399/110

* cited by examiner

*Primary Examiner*—Sandra Brase
(74) *Attorney, Agent, or Firm*—Antonelli, Terry, Stout & Kraus, LLP

(57) ABSTRACT

Two pairs of legs are fitted under two side plates of an electrophotography apparatus, respectively. The two legs in one pair fitted under one of the side plates are disposed on either side of and are spaced from a point which is a cross point of a line joining these two legs, and a line perpendicular to this line, which perpendicular line passes through a projected point obtained by projecting the center of gravity of the electrophotography apparatus onto a horizontal plane on which the apparatus is set up. The two legs in the pair fitted under the other one of the side plates are disposed on either side of and are spaced from a point which is a cross point of a line passing these two legs and a line perpendicular to this line, which perpendicular line passes through the projected point of the center of gravity. The ratio of a shorter distance to a longer distance, of two distances: one between the two legs in a pair and the other between the two legs in the other pair is set to a value of 1/5 to 1/3. With such a arrangement, a defect in an image caused by a distortion in said side plates, due to a position change in the center of gravity of the electrophotography apparatus can be prevented.

10 Claims, 4 Drawing Sheets

ELECTROPHOTOGRAPHY APPARATUS

BACKGROUND OF THE INVENTION

The present invention relates to an electrophotography apparatus, such as a printer, a copy machine, etc. More particularly, the present invention relates to an electrophotography apparatus which is capable of producing a highly reliable picture of high quality by preventing image defects, such as image deformation, without undesirably affecting the positioning accuracy of each printing unit inside the apparatus, when the apparatus is typically placed on a desk or the floor.

In accordance with conventional techniques, the positioning of each structural member in an electrophotography apparatus is ensured by the side plates (or members attached to the side plates) that are disposed perpendicular to the central rotational axes of the respective printing units within the electrophotography apparatus. Further, in order to set up the electrophotography apparatus on a desk or the floor, two legs are attached under one of the side plates and one leg is attached under the other one, or two pairs of legs are attached under each of the respective side plates.

Also, in accordance with the above conventional techniques, the positioning accuracy of each of the devices which make up the electrophotography apparatus depends on the flatness of the surface of the desk or the floor on which the electrophotography apparatus is set up. Generally, an accuracy in the order of 0.1 mm is required for the positioning of each device within the electrophotography apparatus. However, since the surface of a typical desk or a floor sometimes has an irregularity of a few mm, when the electrophotography apparatus is placed on such a surface, the electrophotography apparatus receives a reaction force from that surface, due to its own weight, and the side plates of the electrophotography apparatus, which also ensure the positioning of each device within the electrophotography apparatus, are distorted, and this makes the accurate positioning of each device difficult. If the positioning of each device in the electrophotography apparatus is not accurately maintained, an image produced by the apparatus may be disordered, and a defect in the image, such as an image deformation, may result due to the variations in operational speed of each device, the slipping in an image transfer process, etc. Particularly, in the printing of a multi-colored image, an image is created by precisely superimposing toner images of different colors on an intermediate transfer device in the electrophotography apparatus. Therefore, a higher positioning accuracy is required for each device for the printing of a multi-color image in comparison with the printing of a monochromatic image. If the positioning accuracy of each device is not sufficient, the desired color will not be obtained, due to a misalignment in the superimposition of the color images, and a defect in the image occurs. In order to solve the above problem, it has been suggested as a countermeasure to increase the stiffness of the side plates, for example, by thickening the side plates, so that a distortion in the side plates does not occur even if they receive a reaction force from the surface on which the electrophotography apparatus is placed. However, this countermeasure cannot be adopted because it results in a high production cost and an increase in the weight of the apparatus.

So, a construction has been proposed in which two legs are fitted under one of the side plates of the electrophotography apparatus and one leg is fitted under the other of the side plates. Accordingly, three legs are provided to support the electrophotography apparatus. By use of those three legs, the whole electrophotography apparatus is firmly supported, reclines even if the electrophotography apparatus is placed on a surface with a certain degree of irregularity, and with this arrangement, a distortion does not occur in the side plates. This is because a plane containing three points is uniquely determined.

Further, it is possible to provide an arrangement of the legs of the electrophotography apparatus, in which, although two pairs of legs are attached under the two side plates, respectively, one of the legs is used for adjusting the vertical position of the electrophotography apparatus. That is, this one leg is used to adjust the resting point implemented by this leg, as opposed to the three points implemented by the other three legs, to a plane determined by the three points.

However, in the case where three legs are used, the placement of the electrophotography apparatus is unstable relative to changes in the center of gravity of the electrophotography apparatus. The more the electrophotography apparatus is downsized, the larger will be the portion including devices, such as a developing device, in which toner powder is enclosed, a device which encloses recording media, such as sheets of paper, and so on, whose weight changes according to its history of use, becomes. This influences the degree of change in the center of gravity. Here, with a view toward reducing the fabrication cost, it is desirable to select a material of low cost for the side plates with function to position each device in the electrophotography apparatus, such that the material has as low a stiffness as possible, but has a sufficient stiffness to support the electrophotography apparatus. However, in the case where three legs are attached under the side plates, since the weight of the apparatus is concentrated on a particular one of the three legs, in response to a change in the position of the center of gravity, such as explained above, a distortion occurs in the side plates with low stiffness, and the positioning of each device in the apparatus gets out of order, which in turn causes a defect in the image.

Further, in the electrophotography apparatus, it is necessary to replace expendable components, such as a developing device in which toner powder is enclosed, periodically or according to its stage of use. Also, in order to reduce the price of the electrophotography apparatus, it is desirable for a general user to perform some maintenance tasks on the apparatus, rather than have the maker or seller perform the maintenance tasks. However, as mentioned above, since the setting-up state of the apparatus is not stable due to the support of the apparatus by three legs, if a user applies a part of his weight onto the apparatus, for example, by pressing the top surface of the apparatus with his hand, when he replaces an expendable component, the apparatus may suddenly shift, which causes a discomfort to him. This problem becomes more remarkable as the size or weight of the apparatus becomes more reduced.

On the other hand, in the case where four legs are attached under the electrophotography apparatus, since the setting-up state of the apparatus is stable, the above problem does not occur in response to a change in the center of gravity, or even if a general user replaces an expendable component. However, in adopting this conventional technique, it is necessary to use one of the four legs for the height adjustment of the apparatus. Therefore, when such an electrophotography apparatus is purchased and is set up, it is required to adjust the height of the one leg, corresponding with the surface of the desk or floor on which the apparatus is to be set up. Furthermore, since movement of the apparatus to another location becomes easier with the downsizing or the weight reduction of the electrophotography apparatus, such movement of the apparatus is frequently performed after the initial set-up of the apparatus. However, since the above-discussed adjustment of the apparatus is difficult for a general user to perform, the maker or seller of the apparatus usually implements this adjustment, and this has been a contentious subject from the point of view of reducing the price of the electrophotography apparatus.

SUMMARY OF THE INVENTION

The present invention has the object of providing an electrophotography apparatus which is capable of producing a highly reliable and high-quality picture by preventing image defects, such as an image deformation, and by accurately superimposing plural phosphor images for producing a multi-colored image, without undesirably affecting the positioning accuracy of each printing device inside the electrophotography apparatus, when the electrophotography apparatus is set up on a desk or a floor, which setting-up of the apparatus is easily implemented by a general user, and without discomfort to the user, due to sudden shifting of the apparatus during replacement of an expendable component of the apparatus.

To achieve the above objective, the present invention provides an electrophotography apparatus in which support points are provided for setting up the electrophotography apparatus on a horizontal plane perpendicular to the direction of gravity; two pairs of support points are located in planes facing one another, respectively, spanning the center of gravity of the electrophotography apparatus, the planes being perpendicular to a rotational axis of the exposing rotation device the two support points in each pair are disposed on either side of and are spaced from a line passing through a projected point, obtained by projecting the center of gravity of the electrophotography apparatus onto the horizontal plane, the line being disposed in parallel with the rotational axis of the exposing rotation device; and the ratio of a shorter distance to a longer distance of two distances, one between the two support points in a pair and the other between the two support points in the other pair, is set to a value of 1/5 to 1/3.

Further, the present invention provides an electrophotography apparatus in which each device in the apparatus is positioned and secured by a pair of side plates of the apparatus, which are perpendicular to the rotational axes of the devices, or by a set of positioning parts attached to the side plates; a respective pair of legs are fitted under the respective side plates; the two legs in one pair fitted under one of the side plates are disposed on either of and are spaced from a point which is a cross point of a line joining these two legs and a line perpendicular to this line, which perpendicular line passes through a projected point obtained by projecting the center of gravity of the electrophotography apparatus onto a horizontal plane on which the apparatus is set up; the two legs in the other pair fitted under the other one of the side plates are disposed on either side of and are spaced from a point which is a cross point of a line joining these two legs and a line passing through the projected point of the center of gravity, perpendicular to the line joining these two legs; and the ratio of a shorter distance to a longer distance, of two distances between the two legs in one pair and between the two legs in the other pair, is set to a value of 1/5 to 1/3.

Furthermore, the present invention provides an electrophotography apparatus in which each device in the apparatus is positioned and secured by a pair of side plates of the apparatus, which are perpendicular to the rotational axes of the devices, or by a set of positioning parts attached to the pair of side plates; one pair of legs, and another leg, are fitted under the respective side plates; the two legs in the one pair fitted under one of the side plates are disposed on either side of and are spaced from a point which is a cross point of a line joining these two legs and a line perpendicular to this line, the perpendicular line passing through a projected point obtained by projecting the center of gravity of the electrophotography apparatus onto a horizontal plane on which the apparatus is set up; the one leg fitted under the other one of the side plates is located on the line passing through the projected point of the center of gravity, perpendicular to a line joining the two legs in the pair, the one leg having an elongated cross section; and the ratio of the longitudinal length of the one leg with the elongated cross section to a distance between the two legs of the pair is set to a value of 1/5–1/3.

DETAILED DESCRIPTION OF THE EMBODIMENTS

Figure 1:
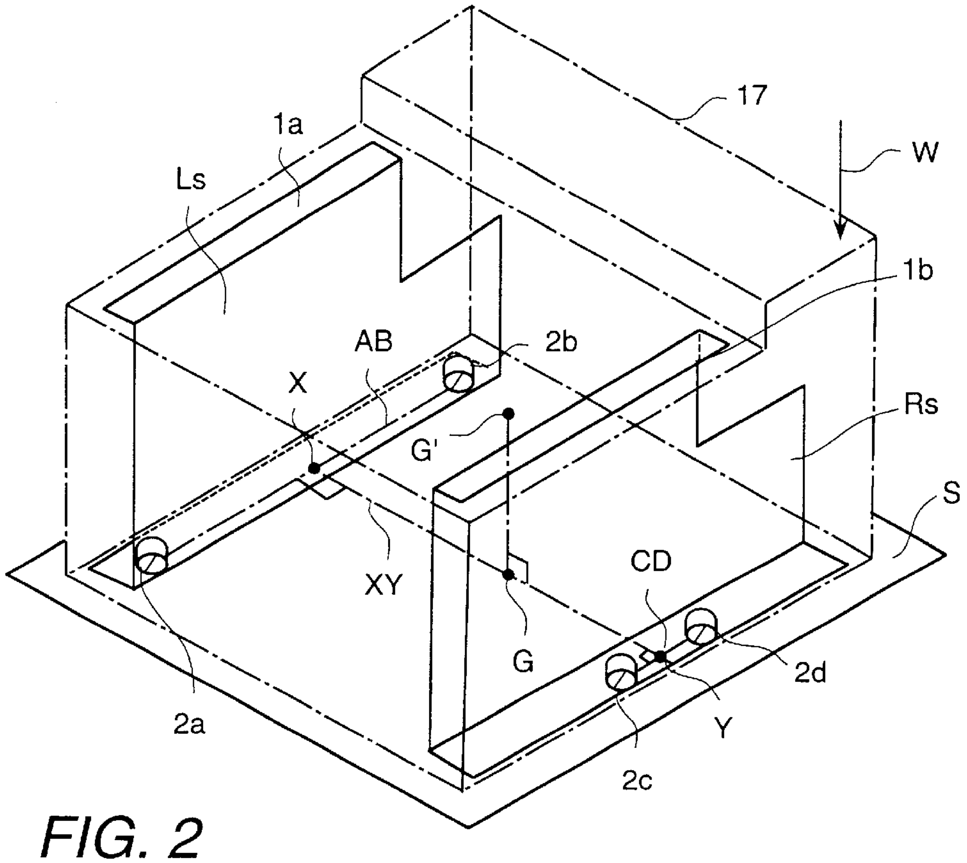
FIG. 1 is a perspective view showing the arrangement of legs attached to an electrophotography apparatus.
Figure 3:
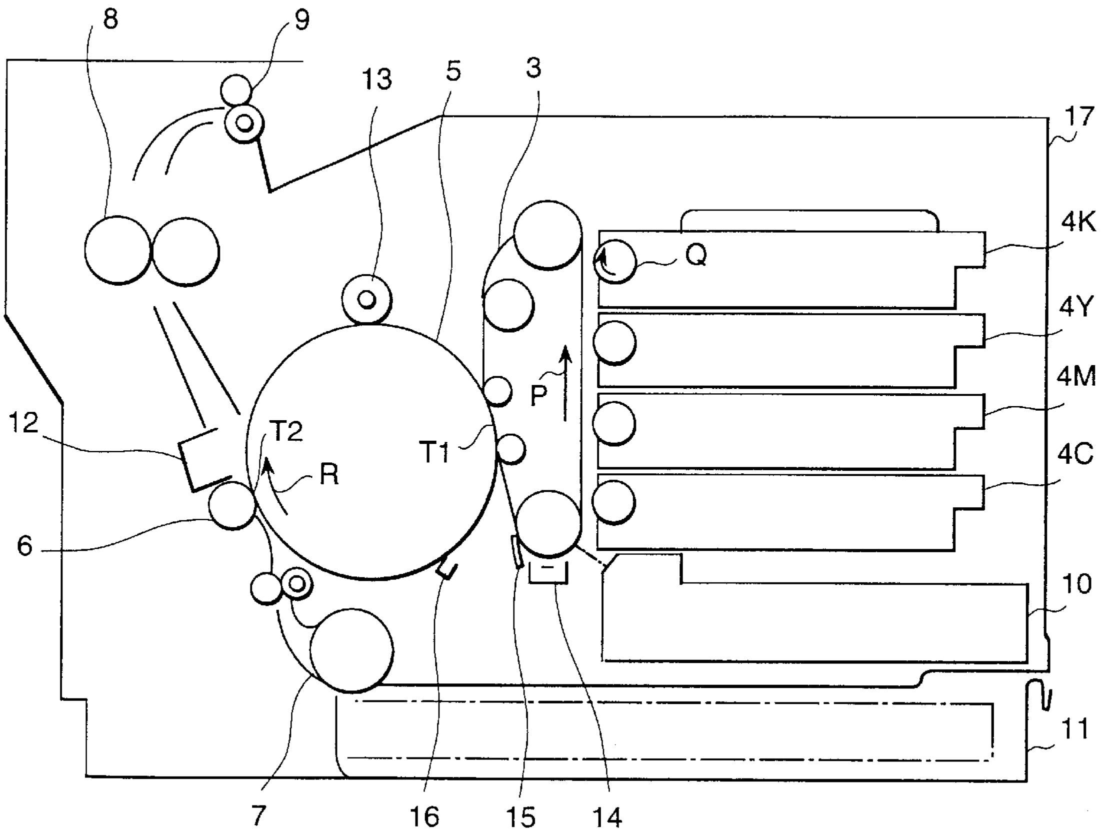
FIG. 3 is a side vertical cross section showing the composition of an electrophotography apparatus.

Hereafter, various embodiments of the invention will be explained with reference to the drawings. FIG. 1 and FIG. 3 show an electrophotography apparatus an embodiment according to the present invention. FIG. 3 shows a side vertical cross section of the electrophotography apparatus 17 of the embodiment, indicating the devices and their location in the electrophotography apparatus 17. An image-formation device 3 consisting of a photoconductor belt (referred to simply as a photoconductor) is set up lengthwise in the vertical direction. Further, developing devices 4K, 4Y, 4M, and 4C, in which toner powder of four different colors are enclosed, respectively, are arranged, in a stacked arrangement, on the right-hand side of the image-formation device 3; and an intermediate image transfer device 5 of a drum shape, a transfer roller 6, a recording medium-feeding device 7, a fixing device 8, and a recording medium-expelling device 9, are arranged on the left-hand side of the image-formation device 3. Moreover, an exposing means 10 for forming an electrostatic latent image on the image-formation device 3 is located under the developing device 4C, and a recording medium-holding means 11 for storing recording media is further located under the exposing means 10. Also, a recording medium-separation means 12 and an intermediate transfer device-cleaning means 13 are arranged around the intermediate image transfer device 5. In addition, a charging device 14, an image-formation device-cleaning means 15, and a latent image-erasing means 16, are arranged around the image-formation device 3.

The operations of the electrophotography apparatus 17 having the above-described composition will be described. First, the image-formation device 3 in the form of a photoconductor belt is driven in the direction indicated by the arrow P by a drive mechanism (not shown in this figure), and the belt is uniformly charged by the charging device 14. Next, picture information, such as an image, characters, and so on, scanned by a personal computer, an image scanner, etc., is dot-wisely exposed by the exposing means 10, and a latent image of the exposed picture information is formed on the surface of the image-formation device 3. After this process, toner powder is fed onto the latent image formed on the image-formation device 3 from one of the developing devices 4K, 4Y, 4M, and 4C; the latent image is visualized as a toner image; and it is transferred to the first image transfer position T1. At the first image transfer position T1, the toner image is transferred onto the surface of the intermediate image transfer device 5 due to the difference between the voltage level of the image-formation device 3 and that of the intermediate image transfer device 5, the voltage being applied by a power source (not shown in this figure). After passing the first image transfer position T1, the surface of the image-formation device 3 is irradiated with light by the latent image-erasing means 16, so as to decrease the potential of the surface to under a predetermined level, and the latent image on the surface is erased. Further, the toner remaining on the surface of the image-formation device 3, which has not been transferred at the first image transfer position T1, is removed, and the surface of the image-formation device 3 returns to a state in which it is capable of forming a new image.

The above-described operations are defined as one operational cycle of the electrophotography apparatus, and image-copy processing is performed is successive cycles for the respective developing devices 4K, 4Y, 4M, and 4C, in turn, in synchronization with the round-trip time of the intermediate image transfer device 5. Thus, a multi-colored toner image is formed on the surface of the intermediate image transfer device 5 by superimposing toner images of respective colors.

Here, a recording medium, such as a paper sheet, is timely transferred to the second image transfer position T2 by the recording medium-feeding device 7, and the monochromatic or multi-colored toner image formed on the surface of the intermediate image transfer device 5 is transcribed onto the recording medium. Further, the recording medium is separated from the intermediate image transfer device 5 by the recording medium-separation means 12, and the toner is fixed onto the recording medium by the fixing device 8 (referred to as the fixing means). Finally, the recording medium is expelled from the electrophotography apparatus. On the other hand, after the transfer of the toner image onto the recording medium, the residue toner remaining on the surface of the intermediate transfer device 5, which has not been transferred onto the recording medium, is removed by the intermediate transfer-cleaning means 13, and the surface of the intermediate image transfer device 5 returns to a state in which it is capable of forming a new toner image.

A feature of the electrophotography apparatus 17 of this construction is that, since the plurality of developing devices 4K, 4Y, 4M, and 4C, can be stacked one above the other, by using a belt type photoconductor, the route of recording medium is also simplified, and the apparatus 17 can be downsized and reduced in weight. Further, another feature of this electrophotography apparatus 17 is that, since the running direction P of the image-formation device 3, the rotational direction Q of toner-carrying members in the developing devices 4K, 4Y, 4M, and 4C, and the rotational direction R of the intermediate image transfer device 5, are in the forward direction in the developing and image transferring processes, there is no shift in synchronization during the developing and image transferring processes; that is, there is no image deformation or shift in the color-superposition, so that a high-quality image can be realized.

However, since the belt-type of photoconductor is used in the electrophotography apparatus 17 of this construction, highly accurate positioning of the image-formation device 3 is required. Generally, if highly accurate positioning of a belt-type device in an electrophotography apparatus is not achieved, there will be a variation in running-speed of the belt-type device, caused by a slip motion or an offset motion of the belt-type device, and this will cause a detect in the produced image, resulting in an image deformation. Since the electrophotography apparatus 17 of the present invention produces a multi-colored image by superimposing toner images of a plurality of colors on the surf ace of the intermediate image transfer device 5, highly accurate parallelism is required among the rotational axes of the plurality of rollers on which the photoconductor belt of the image-formation device 3 is pitched, and with respect to the rotational axis of the intermediate image transfer device 5. If this parallelism is not accurate, a shift in the color-superposition results, which in turn causes a defect in the produced image.

On the other hand, since the fundamental objective of the electrophotography apparatus 17 of this embodiment is to reduce the price of the apparatus 17 by downsizing and weight reduction, the side plates 1*a* and 1*b* are made of a cheap material with the minimum necessary strength. For example, the following conditions are set in this embodiment, that is: the size of the paper as a recording medium is about A4 size; the mounting weight of the apparatus 17 is about 35 kg; a galvanized steel plate with 1.2 mm thickness is used for the side plates 1*a* and 1*b*; and the distance between the side plates 1*a* and 1*b* is 305 mm. If a composition having three legs is adopted for the apparatus 17, the weight of the apparatus 17 sometimes is concentrated on one of the three legs, due to the position change in center of gravity, according to the states of use of the devices in the apparatus; for example, the remaining amount of toner in the developing devices, the remaining amount of recording media, and so on. This concentration of weight on one leg causes distortions in the side plates because of the low stiffness of the plates, and this further causes deterioration of the positioning accuracy of the image-formation device 3, or the intermediate image transfer device 5, which in turn causes a defect in the produced image.

Next, features of the present invention will be explained with reference to various examples shown in the drawings. First, in FIG. 6, imaging devices in the electrophotography apparatus 17 are accurately positioned by positioning parts attached to the side plates 1*a* and 1*b*, situated perpendicular to the rotational axes of the respective imaging devices. Further, the distance between the side plates 1*a* and 1*b* is accurately set up, and the side plates are fastened by positioning members which are fabricated to precise dimensions, using highly stiff material. Furthermore, in order to set up the electrophotography apparatus 17 on a desk or the floor, a pair of legs (referred to as support points) 2*a* and 2*b*, and one leg 2*e*, are fitted under the side plates 1*a* and 1*b*, respectively. The two legs 2*a* and 2*b* fitted under the side plate 1*a* are located on either side of and are spaced from a point X, which is a cross point of a line AB adjoining the legs 2*a* and 2*b* and a line perpendicular to the line AB, which perpendicular line passes through a point G, which is a point obtained by projecting the center of gravity G' of the electrophotography apparatus 17 onto the plane S on which the electrophotography apparatus 17 is set up. Further, the leg 2*e* fitted under the side plate 1*b* is located on the line perpendicular to the line AB, which also passes through the point G.

Figure 7:
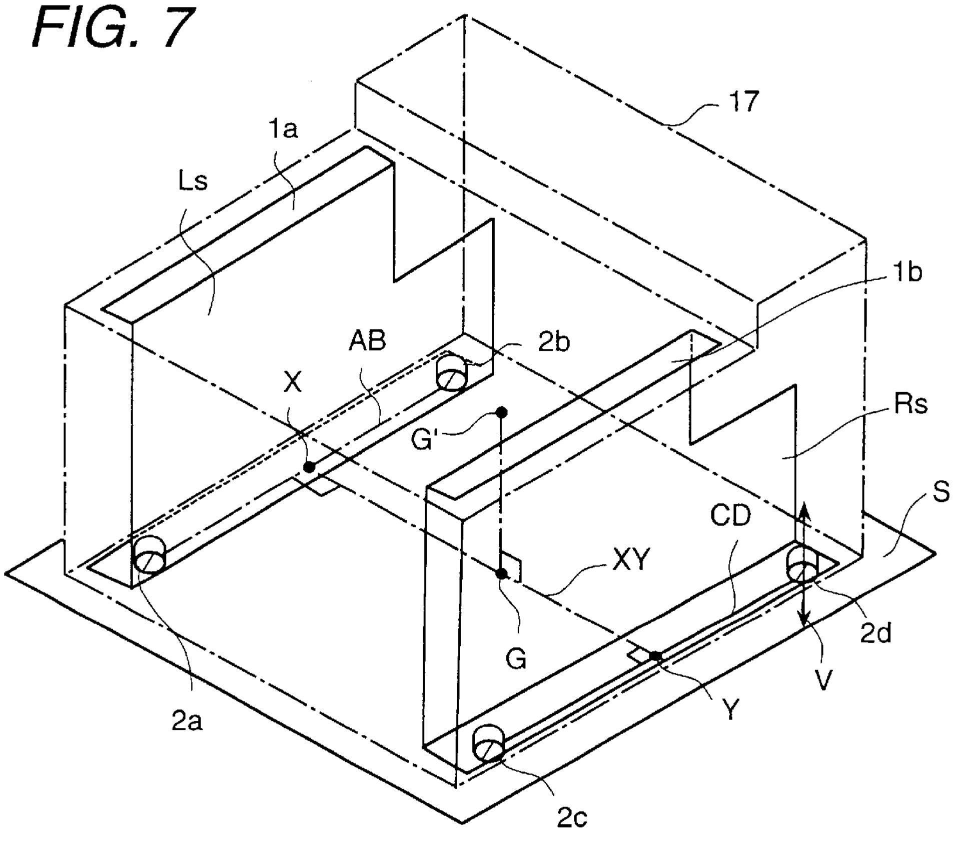
FIG. 7 is a perspective view showing the arrangement of legs attached to an electrophotography apparatus.

Another example is shown in FIG. 7. As shown in FIG. 7, a pair of legs 2*a* and 2*b*, and a pair of legs 2*c* and 2*d*, are fitted under the side plates 1*a* and 1*b*, respectively. Further, the two legs 2*a* and 2*b* and the two legs 2*c* and 2*d* are located as far as possible from the point G, respectively which is a point obtained by projecting the center of gravity G' of the electrophotography apparatus 17 onto the plane S on which the electrophotography apparatus 17 is set up. Furthermore, one of the four legs is used as a height-adjustment leg. For example, the leg 2*d* is fit so as to be movable in the direction indicated by the arrow V.

Figure 6:
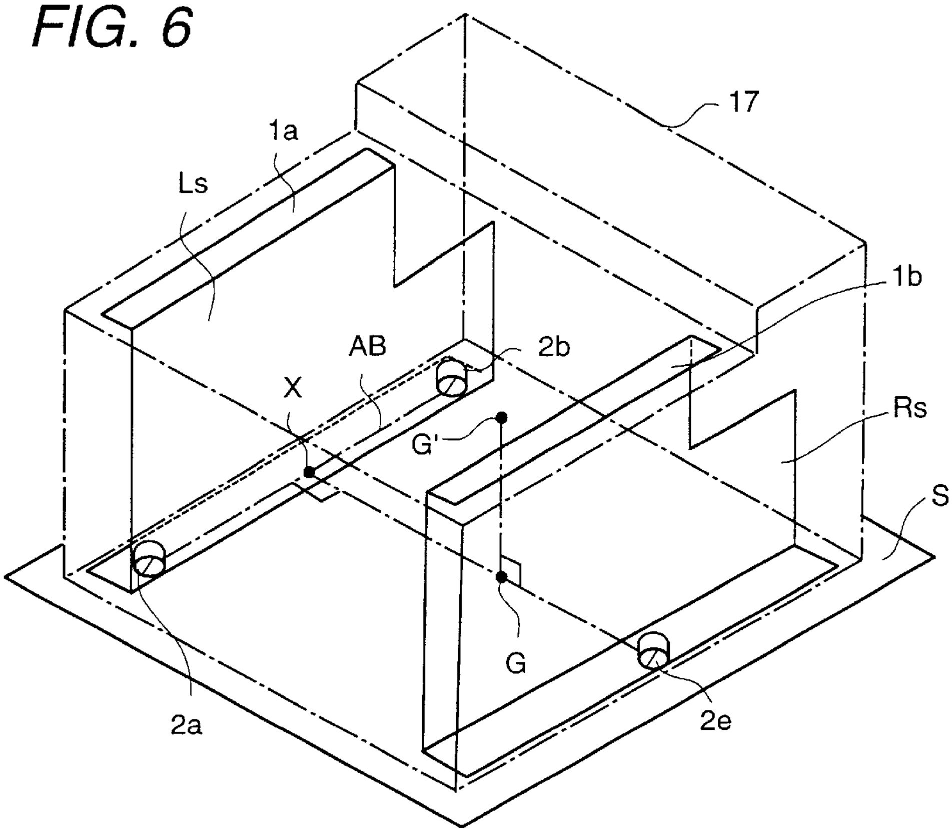
FIG. 6 is a perspective view showing the arrangement of legs attached to an electrophotography apparatus.

Since the electrophotography apparatus 17 is fabricated so as to be downsized and reduced in weight, the set-up state of the apparatus 17 is unstable in the three-leg composition, such as shown in FIG. 6, so that, if a user applies a part of his weight onto the apparatus, for example, by pressing the top surface of the apparatus 17 with his hand, when he replaces an expendable component, the apparatus can suddenly shift, which may startle the user. Therefore, the composition shown in FIG. 7, in which there are four legs, including one height-adjustment leg, is also effective.

Figure 2:
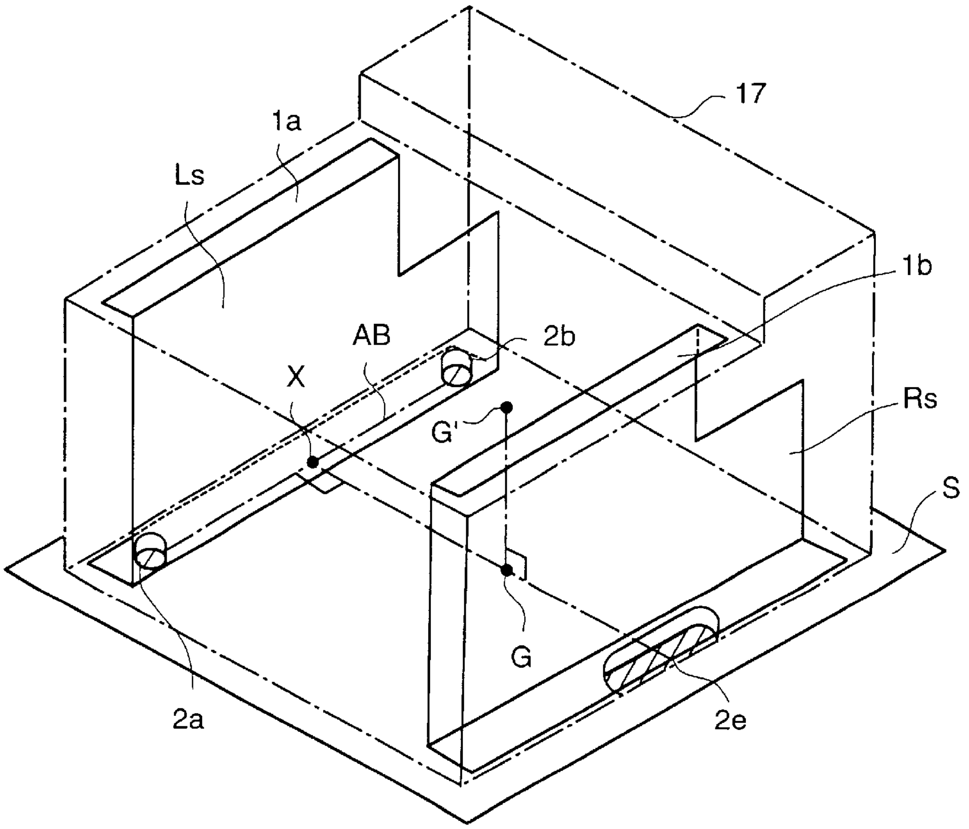
FIG. 2 is perspective view showing the arrangement of legs attached to an electrophotography apparatus of an embodiment according to the present invention.

FIG. 1 is a perspective view showing the arrangement of the side plates 1*a* and 1*b*, and the legs 2*a*, 2*b*, 2*c*, and 2*d*, in the electrophotography apparatus 17. The side plates 1*a* and 1*b* are positioned and fastened using positioning members, not shown in this figure, and the imaging devices, such as an image-formation device, a developing device, etc., are positioned so that the rotational axes of these imaging devices are perpendicular to the plane Ls of the side plate 1*a* and the plane Rs of the side plate 1*b*. Further, the two legs 2*a* and 2*b* used for setting up the electrophotography apparatus 17 on a desk or the floor are fitted under the side plate 1*a*, and two legs 2*c* and 2*d* are fitted under the side plate 1*b*. Here, the two legs 2*a* and 2*b* fitted under the side plate 1*a*, are located on either side of and are spaced from a point X, which is a cross point on a line AB joining the legs 2*a* and 2*b* and a line perpendicular to the line AB, which perpendicular line passes through a point G, which is a point obtained by projecting the center of gravity G' of the electrophotography apparatus 17 onto the plane S on which the electrophotography apparatus 17 is set up. Also, the two legs 2*c* and 2*d* fitted under the side plate 1*b* are located on either side of and are spaced from a point Y, which is a cross point on a line CD joining the legs 2*c* and 2*d* and a line perpendicular to the line CD, which perpendicular line passes through the point G. Meanwhile, the compositions of the other embodiments shown in FIG. 2, FIG. 6, and FIG. 7 are the same except for the arrangement of the legs.

Figure 4:
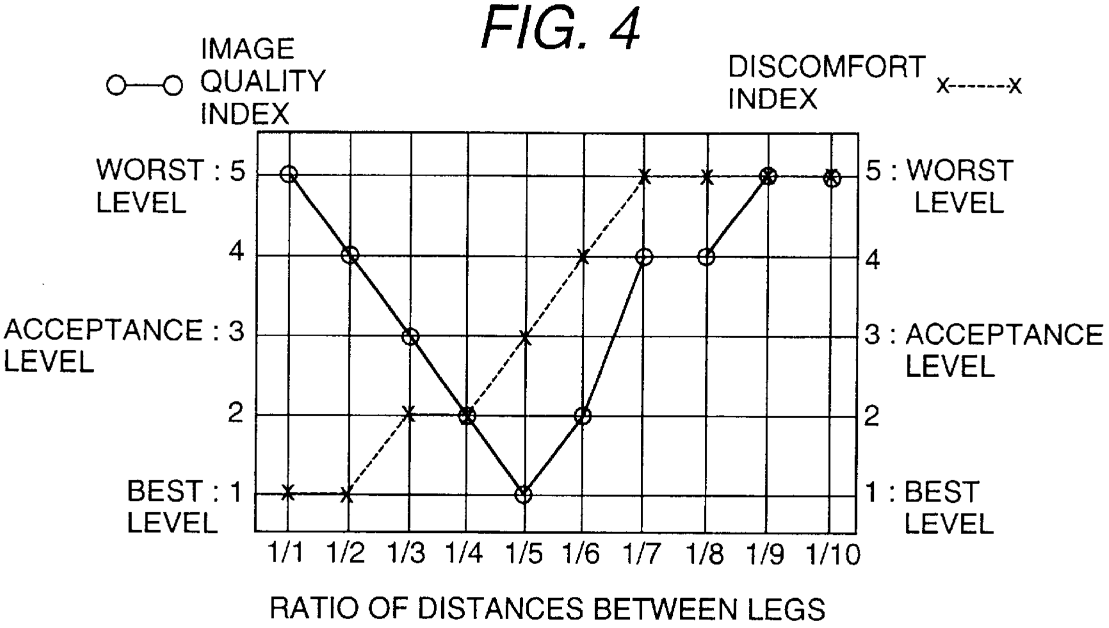
FIG. 4 is a graph showing results of a performance test of an electrophotography apparatus representing an embodiment according to the present invention.

FIG. 4 shows the results of a test for evaluating the stability obtained in setting-up of the apparatus 17 shown in FIG. 1, and the quality of an image presented by the apparatus 17 shown in FIG. 1, with respect to the arrangement of the legs. In this figure, the abscissa indicates the ratio of the distance between the legs 2*a* and 2*b* to the distance between the legs 2*c* and 2*d*. Further, the left and right ordinates indicate the image quality index and the index expressing the degree of discomfort which a user receives from the sudden shifting of the apparatus 17, respectively. Here, the image quality and the discomfort are evaluated according to a five-grade evaluation scheme, in which level 5, level 1, and level 3, indicate the worst level, the best level, and an acceptance limit level, respectively. The image quality is evaluated by repeating an actual printing test under conditions in which the apparatus 17 is set up on a plane S by inserting a spacer of 3 mm thickness between the leg 2*b* and the plane S, for simulating an irregularity in the surface of a standard desk or a typical floor, in order to implement the most severe evaluation conditions. Thus, weight of the apparatus 17 will be concentrated on the leg 2*b*, due to the position change in the center of gravity, and to an extent based on the state of use, such as the remaining amount of recording media and the amount of toner powder remaining in the developing device, in the electrophotography apparatus 17. Further, the degree of discomfort which a user receives from the sudden shifting of the apparatus 17 is evaluated by placing a weight of several kilograms on the weighting point W so as to simulate the condition which exists when a user presses the top face of the apparatus 17 with his hand. From the results of the evaluation test, it is clear that the image quality satisfies a desired acceptance level within the range of 1/6–1/3 in the ratio of the distance between the legs 2*c* and 2*d* to the distance between the legs 2*a* and 2*b*, and the degree of discomfort due to the sudden shifting of the apparatus 17 satisfies its acceptance level for ratios of less than 1/5. That is, both the indices satisfy the two acceptance levels within the ratios of 1/5–1/3.

Figure 5:
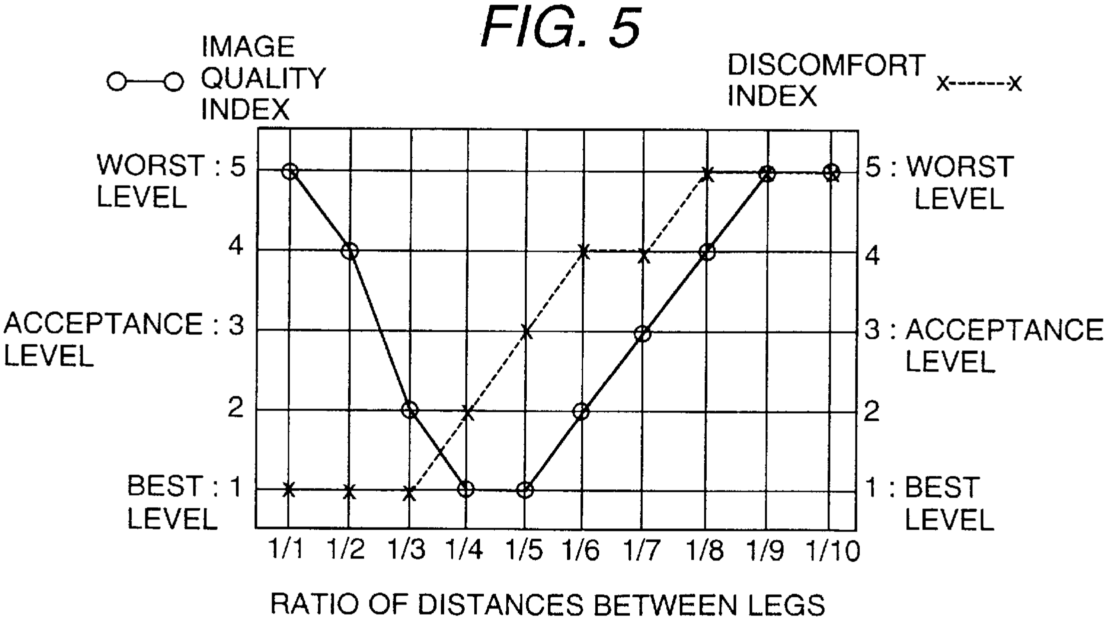
FIG. 5 is a graph showing results of a performance test of an electrophotography apparatus representing another embodiment according to the present invention.

Moreover, FIG. 5 shows the results of a test for a similar evaluation of an electrophotography apparatus of another embodiment. The size of the paper used in this apparatus is about A3 size, and the weight of this apparatus is 45 kg. A galvanized steel plate of 1.6 mm thickness is used for the side plates, and the distance between the two side plates is 419 mm. Here, the composition of this electrophotography apparatus is almost the same as that of the apparatus shown in FIG. 2. From the results of this evaluation test, it is also clear that the image quality satisfies a desired acceptance level within the range of 1/7–1/3 in the ratio of the longitudinal length of the leg 2*e* to the distance between the legs 2*a* and 2*b*, and the degree of discomfort due to the sudden shifting of the apparatus 17 satisfies a desired acceptance level which the ratio is less than 1/5. That is, both the indices satisfy the two acceptance levels within the ratios of 1/5–1/3, similar to the evaluation results of the embodiment of FIG. 4. Since the weight of an electrophotography apparatus with a composition similar to those of the apparatuses of the above two embodiments is approximately proportional to its outside dimensions, the present invention can be applied to an electrophotography apparatus, independent of its size. Here, it is not necessary to fit each leg just under each side plate, but the same effects result when the legs are fitted at places spaced from the positions just under the respective side plates.

Thus, in accordance with the present invention, by setting the ratio of the distance between the legs 2*c* and 2*d* to the distance between the legs 2*a* and 2*b* to a value within the range of 1/5–1/3, it is possible to provide an electrophotography apparatus having the same feature as that of the conventional apparatus shown in FIG. 6, and in which a defect in an image, such as an image deformation, can be prevented without 22 deteriorating the positional accuracy of each imaging device in the electrophotography apparatus when the electrophotography apparatus is set up on a desk or on the floor. This also makes accurate color-superposition for creating a multi-colored image possible, which is necessary to achieve a high-quality image; and, another feature is obtained, in that a defect in an image, due to a positional change in the center of gravity of the apparatus, in dependence on the state of use of the apparatus, can be prevented, and the discomfort which a user receives from sudden shifting of the apparatus at the time of replacing an expendable component can be also prevented. This, in turn, makes it easy for a general user himself to set up the electrophotography apparatus.

Furthermore, the case where two legs 2a and 2b and one leg 2e with an elongated cross section, are fitted under the side plates 1a and 2a, respectively, and the ratio of the longitudinal length in the elongated cross section of the leg 2e to the distance between the legs 2a and 2b is set to a value in the range of 1/5–1/3, creates the same effects as those of the embodiment shown in FIG. 1.

Here, the present invention is especially effective for an electrophotography apparatus, which uses a belt type device, which may be subject to a variation in running-speed due to slipping or an offset motion, for an image-formation device or an intermediate image transfer device. The present invention is also especially effective when a cheap thin steel plate, a thermoplastic resin plate, etc., is used for the side plates of the electrophotography apparatus so as to reduce the price of the apparatus.

As mentioned above, in accordance with the present invention, it has become possible to provide an electrophotography apparatus which is capable of affording a highly reliable and high-quality picture by preventing image defects, such as image deformation, and by making accurate color-superimposing for a multi-colored image possible, without aggravating the positioning accuracy of each printing device inside the electrophotography apparatus, when the electrophotography apparatus is set up on a desk or on the floor. This setting-up of the apparatus also is easily implemented by a general user, and without causing discomfort to a user due to sudden shifting of the apparatus during replacement of an expendable component of the apparatus.

What is claimed is:

1. An electrophotography apparatus including a housing in which there is supported an exposing rotation device having a rotation axis, an exposing device for emitting a laser beam so as to form a latent image on said exposing rotation device, a developing device for developing said latent image formed on the exposing rotation device, a transfer device for transferring said developed latent image onto a recording medium, and a fixing device for fixing said transferred image to said recording medium, said electrophotography apparatus further comprising:

support points used for setting up said electrophotography apparatus so as to support said housing on a horizontal plane which is perpendicular to the direction of gravity, wherein:

(a) said support points consist of two pairs of support points located in respective planes facing one another, which support points span the center of gravity of said electrophotography apparatus, said planes being perpendicular to the rotational axis of said exposing rotation device;

(b) said two support points in each pair are disposed on either side of and are spaced from a line passing through a projected point obtained by projecting the center of gravity of said electrophotography apparatus onto said horizontal plane, this line being in parallel with said rotational axis of said exposing rotation device; and (c) a ratio of a shorter distance to a longer distance, of two distances: one between said two support points in one pair and the other between said two support points in the other pair, is set to a value of 1/5 to 1/3.

2. An electrophotography apparatus according to claim 1, wherein said support points exist on the lower end portions of leg parts, to be put in contact with said horizontal plane.

3. An electrophotography apparatus according to claim 2, wherein the number of said leg parts is at least four.

4. An electrophotography apparatus according to claim 2, wherein the number of said leg parts is three, made up of one pair of legs, and one leg with an elongated cross section; and two support points are arranged at the respective longitudinal end-sides of said one leg having said elongated cross section.

5. An electrophotography apparatus according to claim 1, wherein, with at least one support point in each of four regions, obtained by dividing said horizontal plane with said line passing through said projected point of the center of gravity of said electrophotography apparatus, in parallel with said rotational axis of said exposing rotation device, and a second line passing through said projected point of the center of gravity of said apparatus, perpendicular to said rotational axis, each support point exists near a side plate of said housing which is perpendicular to said rotational axis, for securing said apparatus.

6. An electrophotography apparatus including a housing in which there is supported an image-formation device for holding and transferring an electrostatic latent image, an exposing device for forming said electrostatic latent image on said image-formation device, a plurality of developing devices, each of said developing devices enclosing toner powder of different colors used for forming a toner image by visualizing said electrostatic latent image with said toner powder, an intermediate image transfer device disposed adjacent to said image-formation device for forming a multi-colored image by superimposing respective toner images of different colors, formed on the surface of said image-formation device, in turn, a transfer device for transferring said multi-colored image formed on said intermediate image transfer device onto a recording medium, and a fixing device for fixing said multi-colored image transferred onto said recording medium to this recording medium; wherein (a) each of said devices is positioned and fastened by a pair of side plates of said housing, which are perpendicular to rotational axes of said devices, or by a set of positioning parts attached to said pair of side plates;

(b) two pairs of legs are fitted under said side plates, respectively;

(c) the two legs in one pair fitted under one of said side plates are disposed on either side of and are spaced from a point which is a cross point of a line joining these two legs and a line perpendicular to this line, which perpendicular line passes through a projected point obtained by projecting the center of gravity of the electrophotography apparatus onto a horizontal plane on which said apparatus is set up;

(d) the two legs in the other pair fitted under the other one of said side plates and are spaced from a point which is a cross point of a line joining these two legs and a line perpendicular to this line, which perpendicular line passes through said projected point of the center of gravity; and (e) the ratio of a shorter distance to a longer distance, in two distances: one between said two legs in the one pair and the other between said two legs in the other pair, is set to a value of 1/5 to 1/3.

7. An electrophotography apparatus including a housing in which there is supported an image-formation device for holding and transferring an electrostatic latent image, an exposing device for forming said electrostatic latent image on said image-formation device, a plurality of developing devices, each of said developing devices enclosing toner powder of different colors used for forming a toner image by visualizing said electrostatic latent image with said toner powder, an intermediate image transfer device disposed adjacent to said image-formation device for forming a multi-colored image by superimposing respective toner images of different colors, formed on the surface of said image-formation device, in turn, a transfer device for transferring said multi-colored image formed on said intermediate image transfer device onto a recording medium, and a fixing device for fixing said multi-colored image transferred onto said recording medium to this recording medium; wherein (a) each of said devices is positioned and fastened by a pair of side plates of said housing, which are perpendicular to rotational axes of said devices, or by a set of positioning parts attached to said pair of side plates;

(b) one pair of legs is fitted under one side plate and one leg is fitted under the other side plate;

(c) the two legs in said one pair fitted under said one of said side plates and are spaced from a point which is a cross point of a line joining these two legs and a line perpendicular to this line, which perpendicular line passes through a projected point obtained by projecting the center of gravity of the electrophotography apparatus onto a horizontal plane on which said apparatus is set up;

(d) the one leg fitted under the other one of said side plates is located on said line passing said projected point of the center of gravity, perpendicular to a line joining said two legs in said pair, said one leg having an elongated cross section; and (e) the ratio of the longitudinal length of said elongated cross section at the bottom of said one leg to a distance between said two legs of said pair is set to a value of 1/5–1/3.

8. An electrophotography apparatus according to one of claim 6 and claim 7, wherein one of said image-formation device and said intermediate transfer device is composed by a belt mounted on at least two rollers.

9. An electrophotography apparatus according to one of claim 6 and claim 7, wherein said side plates are made of steel plate of 1–2 mm thickness.

10. An electrophotography apparatus according to one of claim 6 and claim 7, wherein said side plates are made of thermoplastic resin.

* * * * *